United States Patent
Wu et al.

(10) Patent No.: US 8,614,467 B2
(45) Date of Patent: Dec. 24, 2013

(54) METHOD OF GATE WORK FUNCTION ADJUSTMENT AND METAL GATE TRANSISTOR

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/081,505

(22) Filed: Apr. 7, 2011

(65) Prior Publication Data
US 2012/0256279 A1 Oct. 11, 2012

(51) Int. Cl.
*H01L 29/66* (2006.01)
(52) U.S. Cl.
USPC ............ 257/285; 257/E21.621; 257/E21.623; 257/E29.134
(58) Field of Classification Search
USPC ............................ 257/285, E21.623, E29.134
See application file for complete search history.

(56) References Cited

U.S. PATENT DOCUMENTS 6,630,720 B1 * 10/2003 Maszara et al. ............. 257/407
2011/0140207 A1 * 6/2011 Lin et al. .................... 257/412

FOREIGN PATENT DOCUMENTS

TW        201121043        6/2011

* cited by examiner

*Primary Examiner* — Daniel Whalen
(74) *Attorney, Agent, or Firm* — Winston Hsu; Scott Margo

(57) ABSTRACT

A method of gate work function adjustment includes the steps as follow. First, a substrate is provided, wherein a metal gate is disposed on the substrate, a source doping region and a drain doping region are disposed in the substrate at opposite sites of the metal gate, wherein the metal gate is divided into a source side adjacent to the source doping region, and a drain side adjacent to the drain doping region. Later, a mask layer is formed to cover the source doping region and the drain doping region. After that, an implantation process is performed to implant nitrogen into the metal gate so as to make a first nitrogen concentration of the source side higher than a second nitrogen concentration of the drain side. Finally, the mask layer is removed.

4 Claims, 4 Drawing Sheets ically cross-sectional diagrams
METHOD OF GATE WORK FUNCTION ADJUSTMENT AND METAL GATE TRANSISTOR

BACKGROUND OF THE INVENTION

1. Field of the Invention

This invention relates primarily to a method of gate work function adjustment, and more particularly to a method of adjusting gate work function by ion implantation.

2. Description of the Prior Art

In order to provide semiconductor devices with a more rapid operational speed and increased integration degree, a fin field effect transistor (FinFET), which have a structure capable of reducing the short channel effect is invented. The FinFET may include an active region having a three-dimensional fin shape. The fin may be surrounded by a gate electrode. Thus, a three-dimensional channel may be formed along a surface of the fin. Because the channel is formed on an upper surface and sidewalls of the fin, the FinFET may have a larger effect channel width in a relatively small horizontal area. Thus, a semiconductor device having the FinFET may have a relatively small size and a more rapid operational speed.

To simplify the fabricating process, conventionally, a single work function gate is used throughout the fabrication process. Typically, the gate conductor is $N^+$ type polysilicon gate. This results in significant cost savings in fabricating process. However, the $N^+$ type polysilicon gate could result extremely low threshold voltage. To prevent the low threshold voltage, a $P^+$ type polysilicon gate is implemented. Although the $P^+$ type polysilicon gate provides suitable threshold voltage, but it leads to severe gate induced drain leakage.

SUMMARY OF THE INVENTION

This in mind, the present invention provides a method of gate work function adjustment that is capable of providing high threshold voltage and reduce GIDL.

In one aspect, a method of gate work function adjustment includes the steps as follow. First, a substrate is provided, wherein a metal gate is disposed on the substrate, a source doping region and a drain doping region are disposed in the substrate at opposite sites of the metal gate, wherein the metal gate is divided into a source side adjacent to the source doping region, and a drain side adjacent to the drain doping region. Later, a mask layer is formed to cover the source doping region and the drain doping region. After that, an implantation process is performed to implant nitrogen into the metal gate so as to make a first nitrogen concentration of the source side higher than a second nitrogen concentration of the drain side. Finally, the mask layer is removed.

In another aspect, a method of gate work function adjustment, includes the following steps: first, a substrate comprising a metal gate thereon is provided, wherein a source predetermined region and a drain predetermined region is defined at opposite sites of the metal gate, and the metal gate is divided into a source side adjacent to the source predetermined region, and a drain side adjacent to the drain predetermined region. Then, a mask layer is formed to cover the source predetermined region and the drain predetermined region. Subsequently, an implantation process is performed to implant nitrogen into the metal gate so as to make a first nitrogen concentration of the source side higher than a second nitrogen concentration of the drain side. Later, the mask layer is removed. Finally, a source doping region is formed within the source predetermined region, and a drain doping region is formed within the drain predetermined region.

In another aspect, a metal gate transistor, includes: a substrate, a metal gate disposed on the substrate and a source doping region and a drain doping region disposed in the substrate at opposite sites of the metal gate, wherein the metal gate is divided into a source side adjacent to the source doping region, and a drain side adjacent to the drain doping region, and wherein the source side has a first nitrogen concentration, and the drain side has a second nitrogen concentration lower than the first nitrogen concentration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
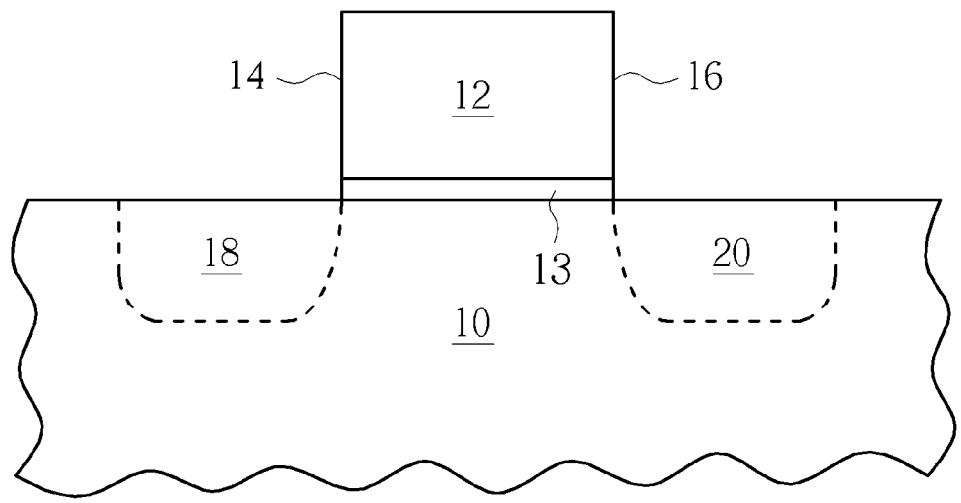
FIG. 1 to FIG. 4 are schematic, cross-sectional diagrams showing a method of gate work function adjustment according to a first preferred embodiment of the present invention.
Figure 2:
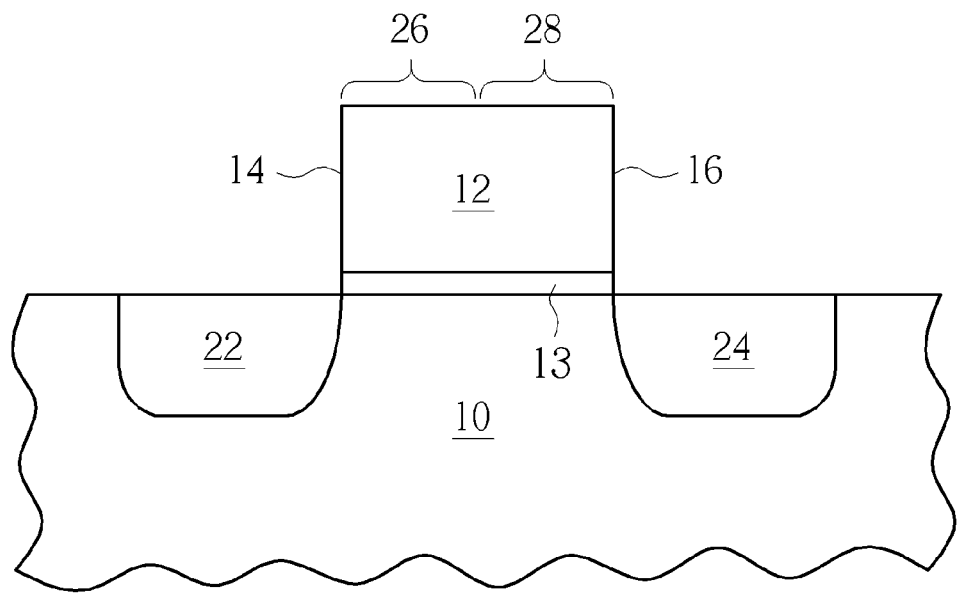
Figure 3:
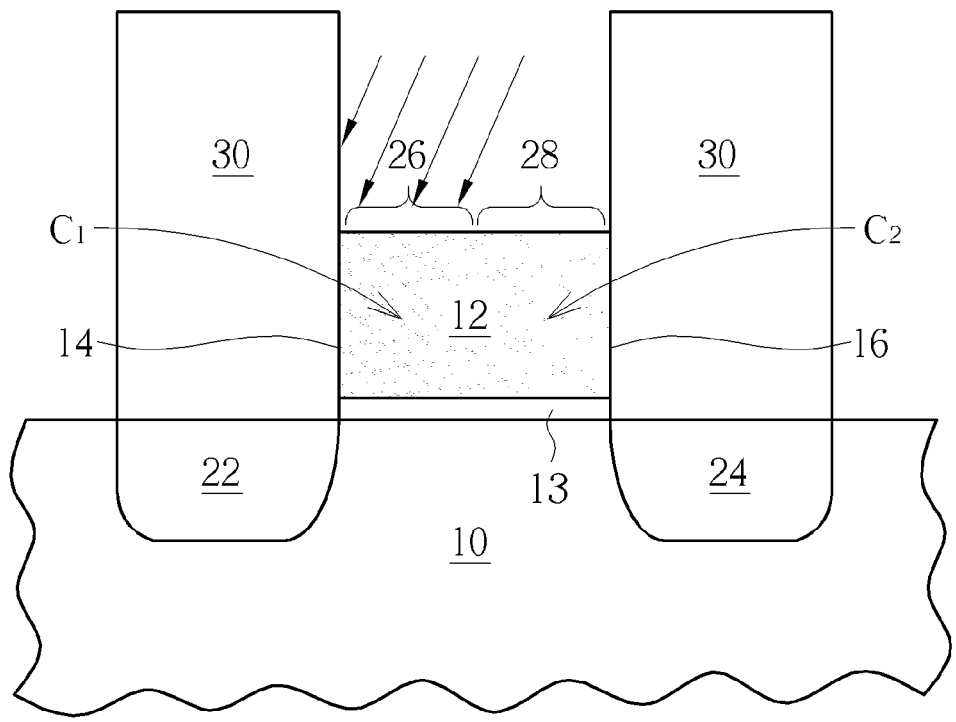
Figure 4:
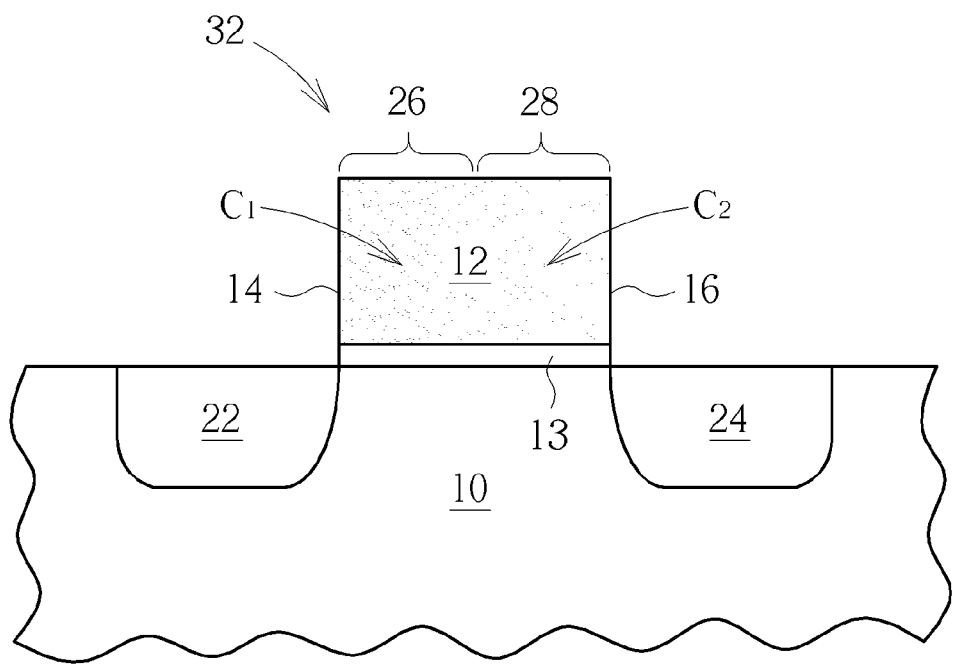
Figure 5:
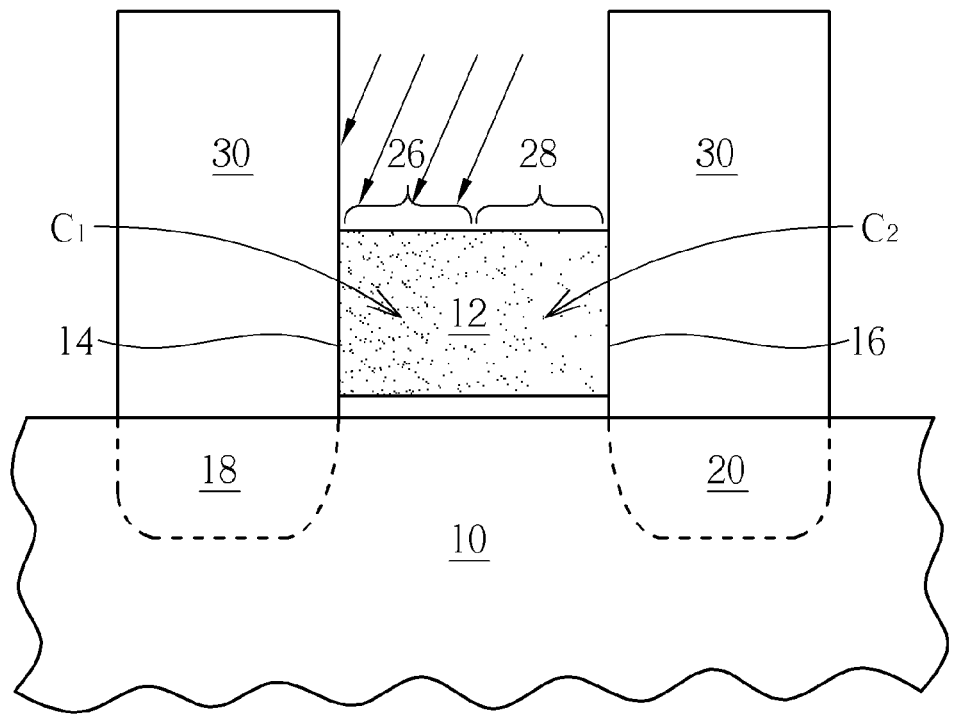
FIG. 5 to FIG. 6 are schematic, cross-sectional diagrams showing a method of gate work function adjustment according to a second preferred embodiment of the present invention.
Figure 6:
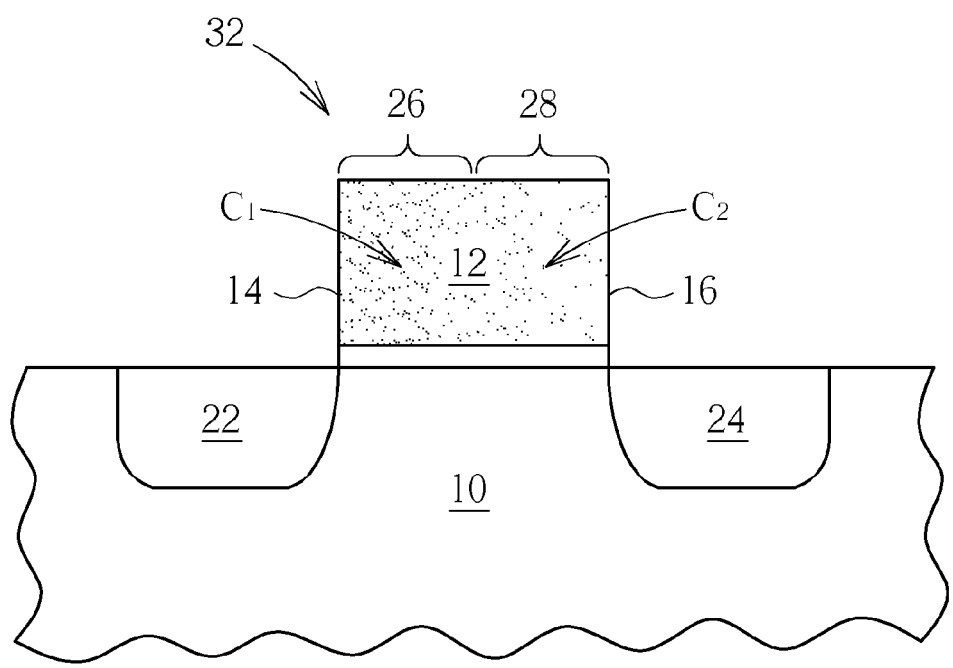

FIG. 1 to FIG. 4 are schematic, cross-sectional diagrams showing a method of gate work function adjustment according to a first preferred embodiment of the present invention. FIG. 1, FIG. 5, and FIG. 6 are schematic, cross-sectional diagrams showing a method of gate work function adjustment according to a second preferred embodiment of the present invention.

As shown in FIG. 1 to FIG. 4, a method of gate work function adjustment according to a first preferred embodiment of the present invention is provided. Please refer to FIG. 1, a semiconductor substrate 10 is provided. A metal gate 12 is disposed on the semiconductor substrate 10. A material layer 13 is disposed between the semiconductor substrate 10 and the metal gate 12. The material of the metal gate 12 can be selected from the group consisting of titanium, gold, silver, aluminum, copper, chromium, nickel, carbon, germanium, cobalt and platinum. Preferably, the metal gate 12 is made of titanium. The metal gate 12 has a first sidewall 14 opposite to the second sidewall 16.

A source predetermined region 18 and a drain predetermined region 20 are defined at two opposed sides of the metal gate 12. As shown FIG. 2, a dopant implantation process is performed to form a source doping region 22 within the source predetermined region 18 and a drain doping region 24 within the drain predetermined region 20 by implanting dopants. The metal gate 12 can be divided into two sides, for example, a source side 26 adjacent to the source doping region 22, and a drain side 28 adjacent to the drain doping region 24.

As shown in FIG. 3, a mask layer 30 such as a photoresist layer is formed to cover the source doping region 22, the drain doping region 24, the first sidewall 14 of the metal gate 12, and the second sidewall 16 of the metal gate 12. The top surface of the mask layer 30 may be higher than the top surface of the metal gate 12. Later, an implantation process is performed to implant nitrogen into the metal gate 12 by taking the mask layer 30 as a mask. After the implantation process, a first nitrogen concentration $C_1$ is formed at the source side 26 of the metal gate 12, and a second nitrogen concentration $C_2$ is formed at the drain side 28 of the metal gate 12. The first nitrogen concentration $C_1$ is higher than the second nitrogen concentration $C_2$. More specifically, the first nitrogen concentration $C_1$ decreases gradually in a direction from the source side 26 toward the drain side 28, and the second nitrogen concentration $C_2$ decreases gradually in a direction from the source side 26 toward the drain side 28. Moreover, the source side 26 contacts the material layer 13, and the drain side 28 contacts the material layer 13 as well.

The implantation process can be a tilt angle implantation process, and the implantation process can be performed several times to adjust the metal gate 12 to a predetermined nitrogen concentration, for example, the first nitrogen concentration $C_1$ and the second nitrogen concentration $C_2$. As shown in FIG. 4, the mask layer 30 is removed. Now, a metal gate transistor 32 with a suitable work function is completed.

According to a second preferred embodiment of the present invention, the nitrogen implanting process can be performed before the source, and drain doping regions formation. A method of gate work function adjustment according to a second preferred embodiment of the present invention can be performed in the fabrication process shown in FIG. 1, FIG. 5 and FIG. 6, wherein Like numbered numerals designate similar or the same parts, regions or elements.

Please refer to FIG. 1, a semiconductor substrate 10 having a metal gate 12 thereon is provided. The metal gate 12 may be titanium, silver, aluminum, copper, chromium, nickel, carbon, germanium, cobalt, tungsten or platinum. Preferably, the metal gate 12 is made of titanium. The metal gate 12 has a first sidewall 14 opposite to a second sidewall 16. A source predetermined region 18 and a drain predetermined region 20 are defined at two opposed sides of the metal gate 12. The metal gate 12 is divided into a source side 26 near the source predetermined region 18, and a drain side 28 near the drain predetermined region 20.

As shown in FIG. 5, a mask layer 30 such as a photoresist layer is formed to cover the source predetermined region 18, the drain predetermined region 20, the first sidewall 14 and the second sidewall 16 of the metal gate 12. The top surface of the mask layer 30 may be higher than the top surface of the metal gate 12. Later, an implantation process is performed to implant nitrogen into the metal gate 12 by taking the mask layer 30 as a mask. After the implantation process, a first nitrogen concentration $C_1$ is formed at the source side 26 of the metal gate 12, and a second nitrogen concentration $C_2$ is formed at the drain side 28 of the metal gate. The first nitrogen concentration $C_1$ is higher than the second nitrogen concentration $C_2$. More specifically, the first nitrogen concentration $C_1$ decreases gradually in a direction from the source side 26 toward the drain side 28, and the second nitrogen concentration $C_2$ decreases gradually in a direction from the source side 26 toward the drain side 28. The implantation process can be a tilt angle implantation process.

Please refer to FIG. 6, the mask layer 30 is removed. After that, a dopant implantation process is performed to form a source doping region 22 within the source predetermined region 18, and a drain doping region 24 within the drain predetermined region 20 by implanting dopants. Now, a metal gate transistor 32 with a suitable work function is completed.

As set forth in FIG. 4, a metal gate transistor 32 with a suitable work function is provided. The metal gate transistor 32 includes a semiconductor substrate 10. The transistor 32 is disposed on the semiconductor substrate 10. The transistor 32 includes a metal gate 12 disposed on the semiconductor substrate 10 and a source doping region 22 and a drain doping region 24 disposed in the semiconductor substrate 10 at opposite sites of the metal gate 12. The metal gate 12 is divided into a source side 26 adjacent to the source doping region 22 and a drain side 28 adjacent to the drain doping region 24. The source side 26 has a first nitrogen concentration $C_1$, and the drain side 28 has a second nitrogen concentration $C_2$. The second nitrogen concentration $C_2$ is lower than the first nitrogen concentration $C_1$. The first nitrogen concentration $C_1$ decreases gradually in a direction from the source side 26 toward the drain side 28. The second nitrogen concentration $C_2$ decreases gradually in a direction from the source side 26 toward the drain side 28.

The metal gate 12 may be titanium, silver, aluminum, copper, chromium, nickel, carbon, germanium, cobalt, tungsten or platinum. Preferably, the metal gate 12 is made of titanium.

Figure 7:
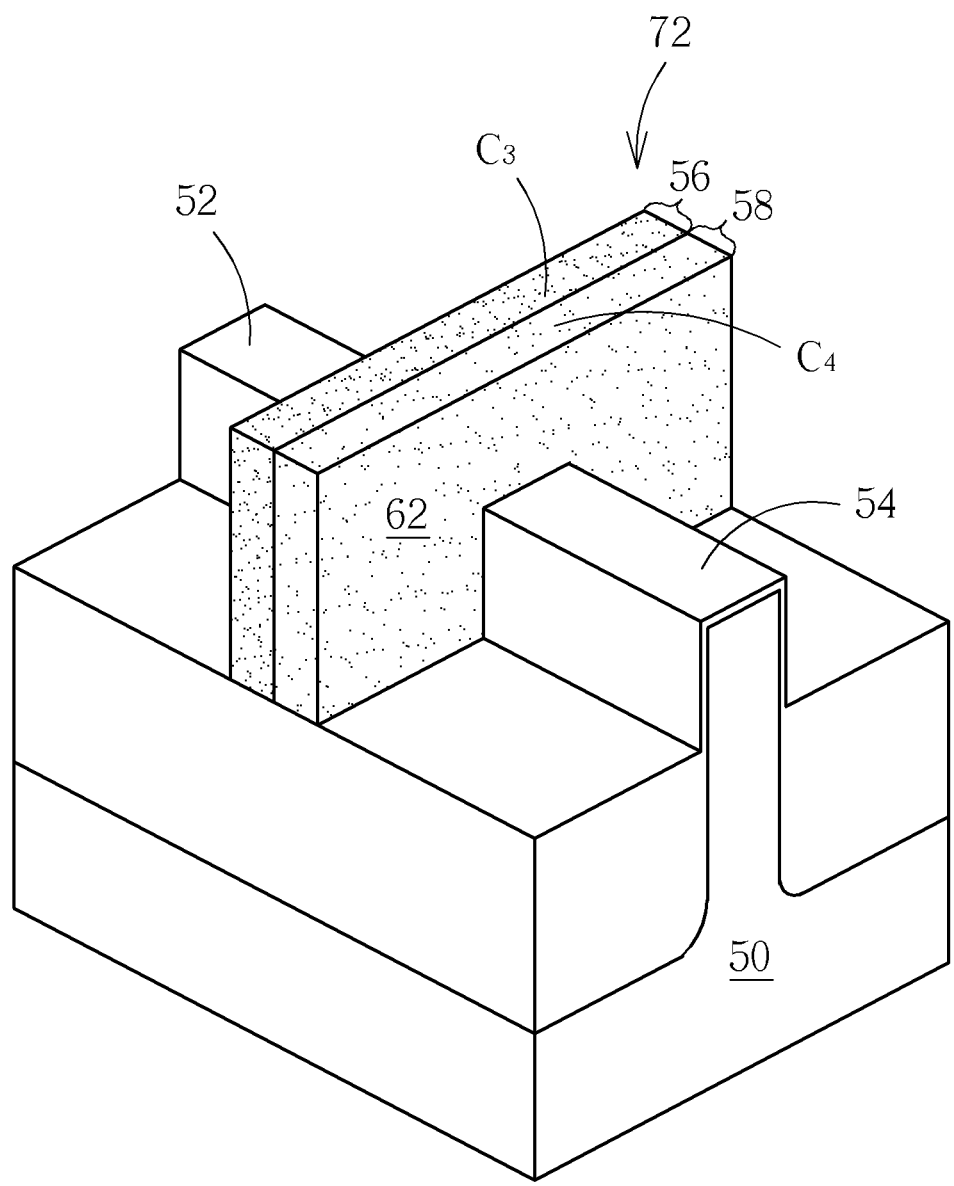
FIG. 7 is schematic, cross-sectional diagram showing a FinFET with an adjusted gate work function.

The method of gate work function adjustment of the present invention can be applied to a FinFET. FIG. 7 depicts a FinFET with a gate work function adjusted. As shown in FIG. 7, a FinFET 72 is disposed on a substrate 50. A source doping region 52 and a drain doping region 54 form a fin structure that extends upwardly away from the substrate 50 upon which they are formed. A metal gate 62 is divided into a source side 56 adjacent to the source doping region 52 and a drain side 58 adjacent to the drain doping region 54. The source side 56 has a first nitrogen concentration $C_3$, and the drain side 58 has a second nitrogen concentration $C_4$. The second nitrogen concentration $C_4$ is lower than the first nitrogen concentration $C_3$. The first nitrogen concentration $C_3$ decreases gradually in a direction from the source side 56 toward the drain side 58. The second nitrogen concentration $C_4$ decreases gradually in a direction from the source side 56 toward the drain side 58.

The work function of a metal gate has been adjusted by the incorporation of nitrogen. It is note-worthy that the concentration of nitrogen increases the work function of the metal gate. For example, the source side has the first nitrogen concentration higher than the second nitrogen concentration of the drain side. Therefore, the source side of the metal gate has higher work function than the drain side of the metal gate. Furthermore, because the first nitrogen concentration decreases gradually from the source side toward the drain side, the work function of the source side is decreased in a direction from the source side toward the drain side. Similarly, the second nitrogen concentration decreases gradually from the source side toward the drain side, therefore, the work function of the drain side is decreased in a direction from the source side toward the drain side. In this way, the metal gate transistor can provide high threshold voltage and low GIDL effect.

Those skilled in the art will readily observe that numerous modifications and alterations of the device and method may be made while retaining the teachings of the invention.

What is claimed is:

1. A metal gate transistor, comprising:
   a substrate;
   a metal gate consisting of a monolithic, single-layer nitrogen-doped metal disposed on the substrate;
   a material layer disposed between the metal gate and the substrate; and
   a source doping region and a drain doping region disposed in the substrate at opposite sites of the metal gate, wherein the metal gate is divided into a source side adjacent to the source doping region, and a drain side adjacent to the drain doping region, wherein the source side and the drain side are made of the same metal material, the source side contacts the material layer, and the drain side contacts the material layer and wherein the source side has a first nitrogen concentration, and the drain side has a second nitrogen concentration lower than the first nitrogen concentration.

2. The metal gate transistor of claim 1, wherein the metal gate is made of titanium.

3. The metal gate transistor of claim 1, wherein the first nitrogen concentration decreases gradually in a direction from the source side toward the drain side.

4. The metal gate transistor of claim 1, wherein the second nitrogen concentration decreases gradually in a direction from the source side toward the drain side.

* * * * *